(12) United States Patent
Colin et al.

(10) Patent No.: US 11,663,932 B2
(45) Date of Patent: May 30, 2023

(54) STAND FOR SUPPORTING A DISPLAY BOARD

(71) Applicant: MillerKnoll, Inc., Zeeland, MI (US)

(72) Inventors: Kimberlee Colin, London (GB); Luca Corvatta, London (GB); Samuel Hecht, London (GB); Tyler Finses, Holland, MI (US)

(73) Assignee: MillerKnoll, Inc., Zeeland, MI (US)

(*) Notice: Subject to any disclaimer, the term of this patent is extended or adjusted under 35 U.S.C. 154(b) by 0 days.

(21) Appl. No.: 17/082,917

(22) Filed: Oct. 28, 2020

(65) Prior Publication Data

US 2022/0130285 A1 Apr. 28, 2022

(51) Int. Cl.
*G09F 7/18* (2006.01)
*F16M 11/04* (2006.01)
*G09F 21/00* (2006.01)
*F16M 11/42* (2006.01)
*H05K 7/14* (2006.01)

(52) U.S. Cl.
CPC ............ *G09F 7/18* (2013.01); *F16M 11/041* (2013.01); *F16M 11/42* (2013.01); *G09F 21/00* (2013.01); *G09F 2007/1843* (2013.01); *G09F 2007/1856* (2013.01); *H05K 7/14* (2013.01)

(58) Field of Classification Search
CPC .... G09F 7/18; G09F 21/00; G09F 2007/1843; G09F 2007/1856; F16M 11/041; F16M 11/42; H05K 7/14; H05K 7/1417
See application file for complete search history.

(56) References Cited

U.S. PATENT DOCUMENTS

| | | | | |
|---|---|---|---|---|
| 2,235,977 A | * | 3/1941 | Bitney | A47F 5/135 211/55 |
| 3,216,580 A | * | 11/1965 | Fricker, Jr. | H05K 7/1417 211/41.17 |
| 3,404,785 A | * | 10/1968 | Emary | H05K 7/14 211/183 |
| 3,610,562 A | | 10/1971 | Holmes et al. | |
| 3,743,105 A | * | 7/1973 | David | A47F 5/13 211/153 |
| 4,154,173 A | | 5/1979 | Chesnut | |
| 4,921,506 A | * | 5/1990 | Poulton | B42F 9/00 24/504 |
| 5,244,267 A | | 9/1993 | Frossier, Jr. et al. | |
| 5,449,074 A | * | 9/1995 | Paulson | B62H 3/00 211/22 |
| 5,697,595 A | | 12/1997 | Sperber | |
| 6,691,963 B1 | | 2/2004 | Padiak et al. | |
| 7,284,732 B1 | * | 10/2007 | Lopa | B65B 67/1233 248/101 |

(Continued)

FOREIGN PATENT DOCUMENTS

DE 2459719 A1 6/1976
FR 3025349 B1 9/2016

*Primary Examiner* — Tan Le
(74) *Attorney, Agent, or Firm* — Michael Best & Friedrich LLP

(57) ABSTRACT

A stand for supporting a board includes a wire frame having a first portion configured to support an edge of the board, and a second portion extending from the first portion. The stand also includes a latch mounted on the second portion. The latch is operable to restrain movement of the board relative to the wire frame.

19 Claims, 4 Drawing Sheets

(56) References Cited

U.S. PATENT DOCUMENTS

| | | | |
|---|---|---|---|
| 8,225,946 B2* | 7/2012 | Yang | A47K 17/00 |
| | | | 108/108 |
| 8,770,587 B2 | 7/2014 | Diercks | |
| 9,735,485 B2* | 8/2017 | Schulze | H01R 12/7029 |
| 2012/0097406 A1* | 4/2012 | Silcox | E04B 9/006 |
| | | | 248/228.3 |
| 2020/0370313 A1* | 11/2020 | Ballantyne | F16B 1/00 |

* cited by examiner

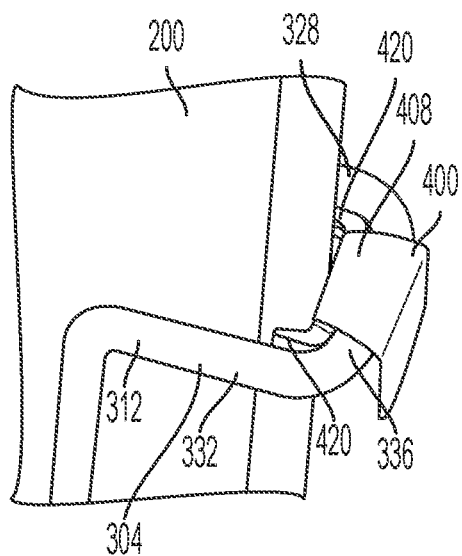
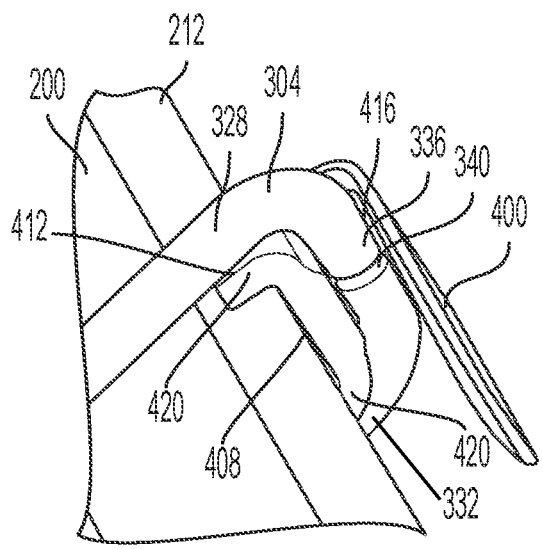
FIG. 4    FIG. 5
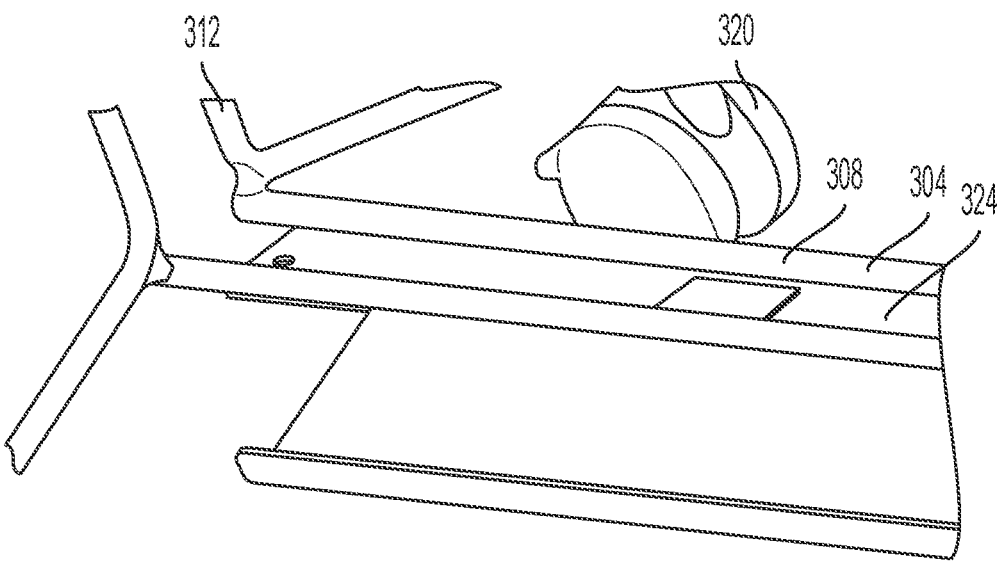
FIG. 6

STAND FOR SUPPORTING A DISPLAY BOARD

FIELD OF THE INVENTION

The present invention relates to support systems for display boards, and more particularly to stands having latches for securing boards within the stands.

BACKGROUND OF THE INVENTION

Display boards, including cork boards and white boards, may be supported by stands. In many cases, display boards are integral with the stands. As such, the ability to remove a display board from a stand is limited. The ability to rearrange the position of the display board within the stand is also restricted. Furthermore, the ability to remove the display board from the stand and attach the display board to another stand is restricted.

SUMMARY OF THE INVENTION

The present invention provides, in one aspect, a stand for supporting a board. The stand includes a wire frame having a first portion configured to support an edge of the board, and a second portion extending from the first portion. The stand further includes a latch mounted on the second portion. The latch is operable to restrain movement of the board relative to the wire frame.

The present invention provides, in another independent aspect, a stand for supporting a board. The stand includes a frame having a first portion configured to support an edge of the board, and a second portion extending from the first portion. The stand further includes a wheel coupled to the first portion of the frame. The wheel is configured to facilitate movement of the frame along a surface. The stand further includes a latch mounted on the second portion. The latch is movable between a first position, in which the board is removable from the frame, and a second position, in which the board is restrained from movement relative to the wire frame.

The present invention provides, in another independent aspect, a support system including a board having a bottom edge, a first side edge, and a second side edge. The support system also includes a stand including a wire frame having a first portion that supports the bottom edge of the board, a second portion extending from the first portion along the first side edge of the board, and a third portion extending from the first portion along the second side edge of the board. The stand also includes a wheel coupled to the wire frame to facilitate movement of the wire frame along a surface, and a first latch mounted on the second portion. The first latch is operable to engage the first side edge of the board to restrain movement of the board relative to the wire frame. The stand further includes a second latch mounted on the third portion. The second latch is operable to engage the second side edge of the board to restrain movement of the board relative to the wire frame.

Other features and aspects of the invention will become apparent by consideration of the following detailed description and accompanying drawings.

BRIEF DESCRIPTION OF THE DRAWINGS

FIG. 4 is an enlarged, top perspective view of a portion of the support system of FIG. 1, illustrating a latch of the support system.

FIG. 5 is an enlarged, bottom perspective view of the portion of the support system of FIG. 1.

FIG. 6 is an enlarged perspective view of a portion of the stand of FIG. 3 with the board removed.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting.

DETAILED DESCRIPTION

Figure 1:
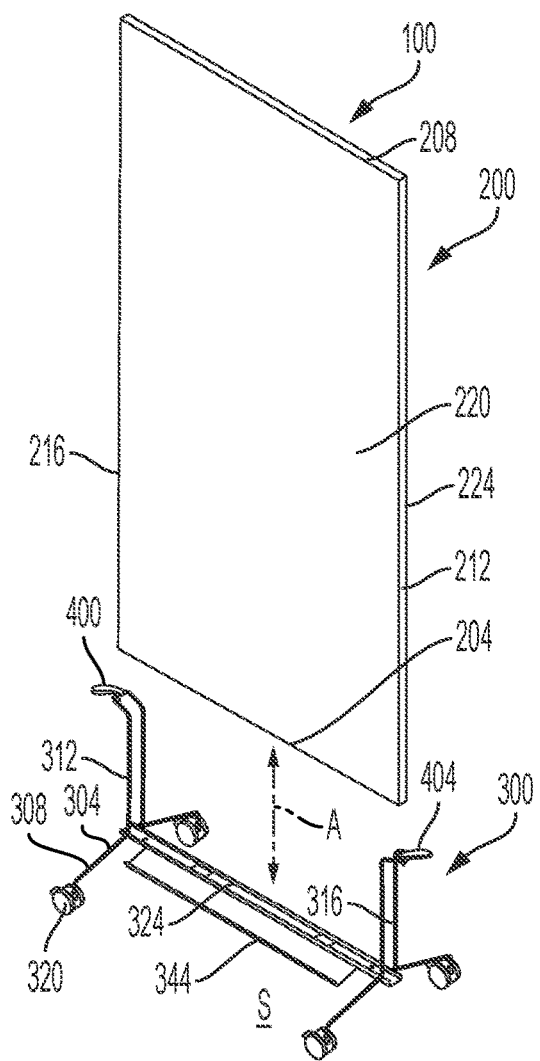
FIG. 1 is a perspective view of a support system with a board removed from a stand.
Figure 2:
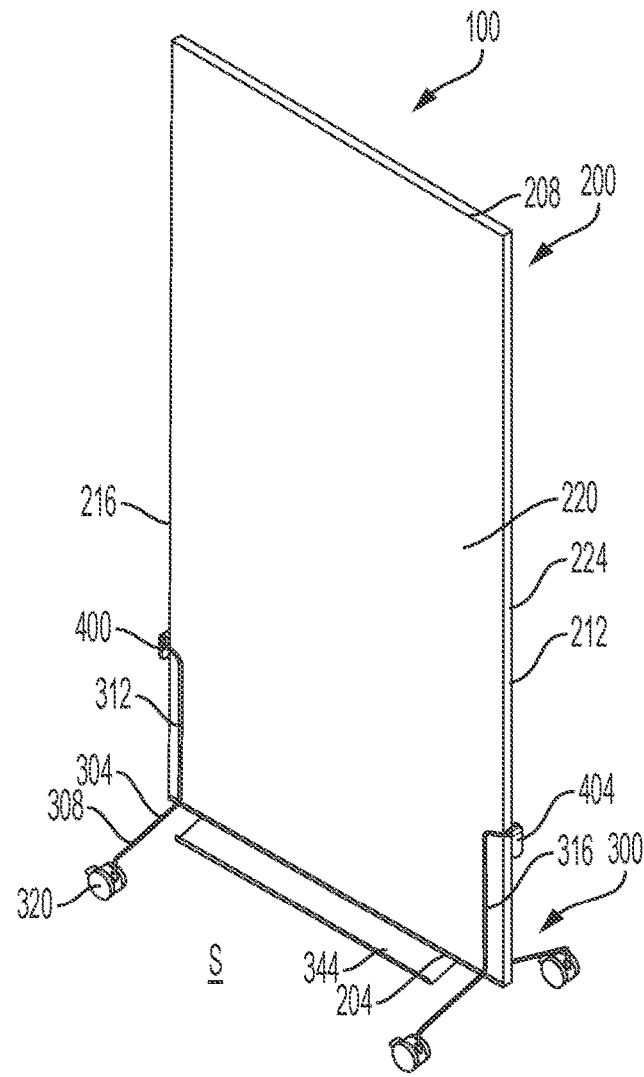
FIG. 2 is a perspective view of the support system of FIG. 1 with the board secured to the stand.

FIGS. 1 and 2 illustrate a support system 100 including a board 200 and a stand 300. The stand 300 is operable to support the board 200 upon a surface S. FIG. 1 illustrates the support system 100 with the board 200 removed from the stand 300. FIG. 1 also illustrates an arrow A showing how the board 200 is secured to and removed from the stand 300. In the illustrated embodiment, the board 200 is translated along the arrow A into and out of engagement with the stand 300. FIG. 2 illustrates the support system 100 with the board 200 secured to the stand 300 by one or more latches 400, 404.

As shown in FIG. 1, the board 200 includes a bottom edge 204 and a top edge 208. The board 200 further includes side edges 212, 216 extending between the bottom edge 204 and the top edge 208. The board 200 includes a first (i.e., front) surface 220 and a second (i.e., rear) surface 224. The board 200 may be, without limitation, a whiteboard, a blackboard, a poster board, a cork board, a panel, or the like. The board 200 may be dimensioned to correspond with the stand 300. The board 200, when removed from the stand 300, can be rotated or flipped such that when the board 200 is reintroduced to the stand 300, the board surface 220, 224 facing a user is in a different orientation (e.g., rotated 90 or 180 degrees) or is the opposite surface 220, 224. Other stands 300 may be dimensioned to support the board 200 thereon.

Figure 3:
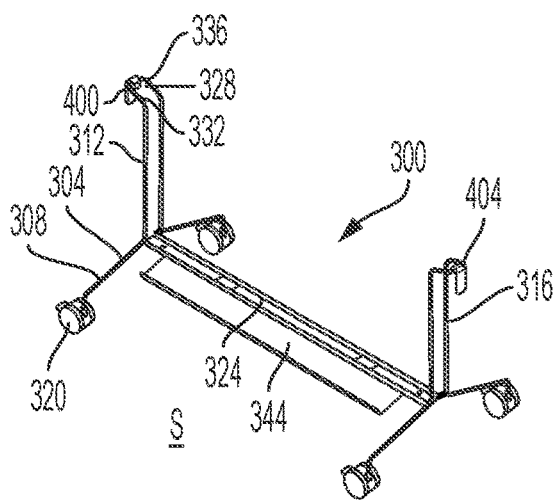
FIG. 3 is a perspective view of the stand of FIG. 1.

FIG. 3 illustrates the stand 300. The stand 300 includes a frame 304. In the illustrated embodiment, the frame 304 is a wire frame. In other embodiments, the frame 304 may be made of other suitable materials or have other constructions. The illustrated frame 304 includes a first portion 308, a second portion 312, and a third portion 316. The first portion 308 of the wire frame 304 is configured to support one of the edges 204, 208 of the board 200. As illustrated in FIG. 2, the second portion 312 extends from the first portion 308 along the side edge 212 of the board 200. The third portion 316 extends from the first portion 308 along the side edge 216 of the board 200. As such, the second portion 312 and third portion 316 extend from opposite ends of the first portion 308. In the illustrated embodiment, the second portion 312 and the third portion 316 extend generally perpendicularly from the first portion 308. However, the second and third portions 312, 316 may otherwise extend from the first portion 308. In the illustrated embodiment, the second portion 312 and the third portion 316 extend a relatively small distance up lengths of the side edges 212, 216. For example, the second and third portions 312, 316 may extend less than a quarter the lengths of the side edges 212, 216. The second and third portions 312, 316 may alternatively extend less than half the lengths of the side edges 212, 216. Both the second and third portions 312, 316 are cantilevered from the first portion 308. The second and third portions 312, 316 are both operable to deflect relative to the first portion 308 as the latches 400, 404 secure the board 200 to the stand 300. The second and third portions 312, 316 can deflect in at least a direction corresponding to the width (i.e., between the side edges 212, 216) of the board 200 and a direction corresponding to the depth (i.e., between first and second surface 220, 224) of the board 200. The wire frame construction of the frame 304 allows the second and third portions 312, 316 to deflect and return to position.

With continued reference to FIG. 3, the stand 300 further includes wheels 320 coupled to the first portion 308. The wheels 320 facilitate movement of the frame 304 along the surface S. In the illustrated embodiment, the wheels 320 are caster wheels configured to facilitate multidirectional movement of the frame 304 along the surface S in many directions. The caster wheels 320 may be lockable swivel caster wheels 320. The lockable swivel caster wheels 320 permit a user to move the stand 300 in many directions along the surface S, and to subsequently lock the location of the support system 100 at a desired location on the surface S. Other wheels 320 are possible.

With continued reference to FIG. 3 and new reference to FIG. 6, the stand 300 further includes a pad 324. The pad 324 is attached to the first portion 308 of the wire frame 304. The pad 324 is configured to support one of the edges 204, 208 of the board 200. The pad 324 may be comprise a material having a relatively high coefficient of friction. As such, the pad 324 is configured to support the edge 204 of the board 200 and to restrain the board from sliding relative to the wire frame 304. The pad 324 may also be made of a relatively softer material than the first portion 308 of the frame 304. As such, the pad 324 may reduce the possibility of the frame 304 marring or damaging the edges 204, 208 of the board 200 if the board 200 is dropped into the stand 300 or shifts relative to the stand 300.

Figure 7:
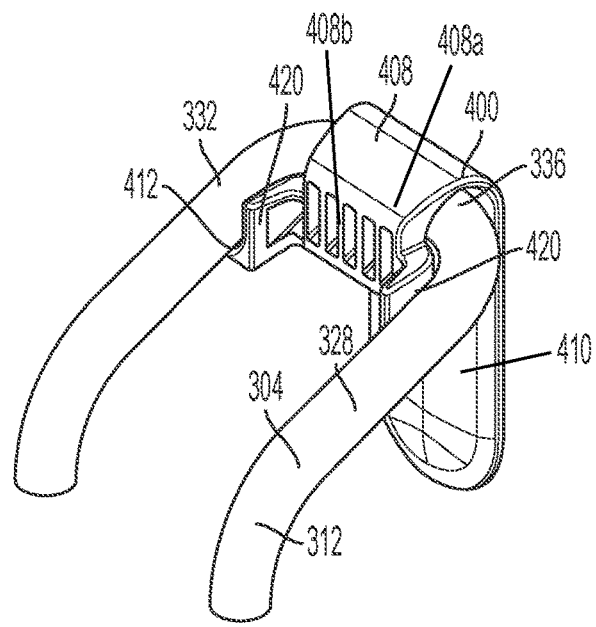
FIG. 7 is a perspective view of the latch of FIG. 4.
Figure 8:
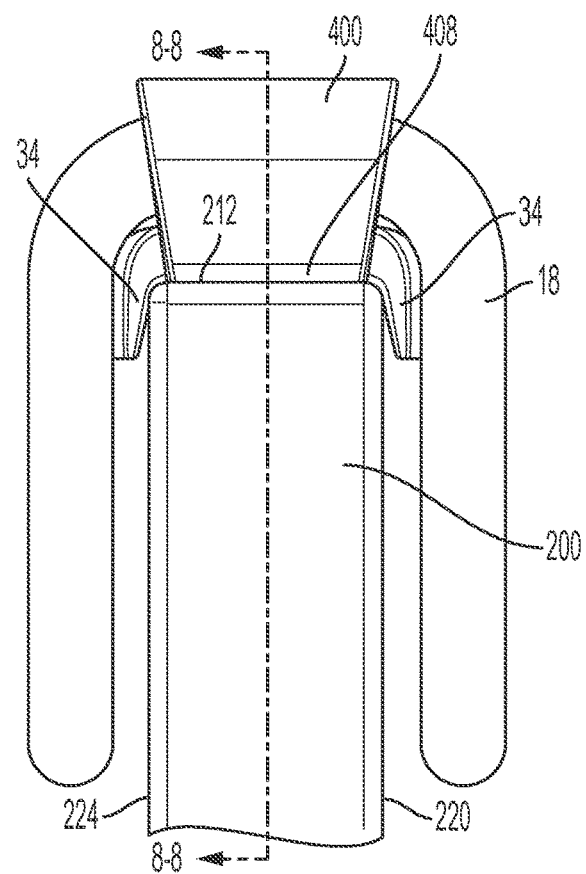
FIG. 8 is an enlarged, top view of a portion of the support system of FIG. 1.

As most clearly seen in FIGS. 7 and 8, the second portion 312 of the wire frame 304 includes a first side 328, a second side 332, and a connecting side 336 extending between the first side 328 and the second side 332. In the illustrated embodiment, the first side 328, second side 332, and connecting side 336 generally form a U shape. When the board 200 is secured in the frame 304 (as illustrated in FIG. 8), the first side 328, second side 332, and connecting side 336 wrap around the side edge 212 of the board 200. In the illustrated embodiment, the edge 212 of the board 200 is nested within the U shape defined by the first side 328, second side 332, and connecting side 336. Although not illustrated in detail, the third portion 316 of the frame 304 has a similar construction as the second portion 312 to wrap around the side edge 216 of the board 200.

As seen in FIG. 5, the connecting side 336 of the second portion 312 includes a groove 340. The groove 340 has an outer diameter smaller than the outer diameter of the remainder of the wire frame 304. The groove 340 may extend circumferentially around the wire frame 304. The groove 340 may be located equidistant from the first side 328 and the second side 332 to be located centrally on the wire frame 304. In other embodiments, the groove 340 may be otherwise spaced from the first side 328 and the second side 332. As will be discussed below with regards to the latch 400, the groove 340 is configured to engage and align the latch 400 relative to the wire frame 304.

As shown in both FIGS. 3 and 6, the stand 300 may also include a tray 344 for holding materials for use with the board 200. The tray 344 is secured to the first portion 308 of the frame 304. The tray 344 extends outwardly from the first portion 308. For example and without limitation, the tray 344 may hold writing utensils, erasers, push pins, and the like for use with the board 200. In some embodiments, the stand 300 may include two trays 344, with one tray extending from each side of the first portion 308. In other embodiments, the tray 344 may be omitted.

With continued reference to FIG. 3, one of the latches 400 (i.e., a first latch) is mounted on the second portion 312, and another of the latches 404 (i.e., a second latch) is mounted on the third portion 316. In the illustrated embodiment, the stand 300 includes two latches 400, 404, with one latch 400, 404 on each portion 312, 316. In other embodiments, the stand 300 may only include one latch on one of the portions 312, 316. Although only the first latch 400 is described in detail below, the second latch 404 is similarly constructed and functions in a similar manner.

Figure 9:
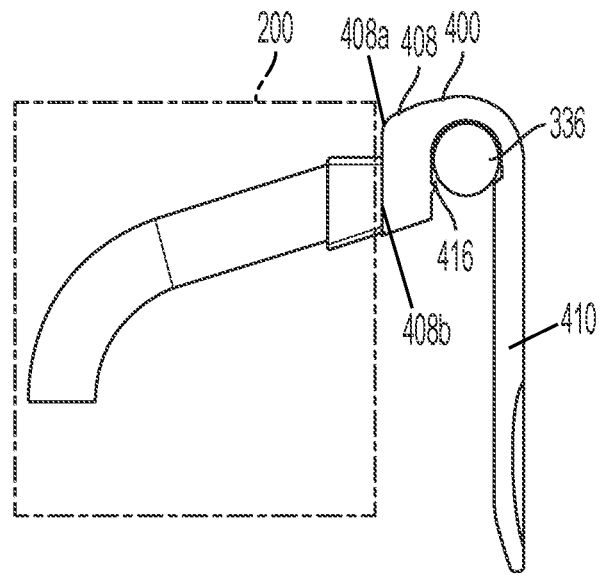
FIG. 9 is a cross-sectional view taken along section line 8-8 in FIG. 8 with the latch in a locked position.
Figure 10:
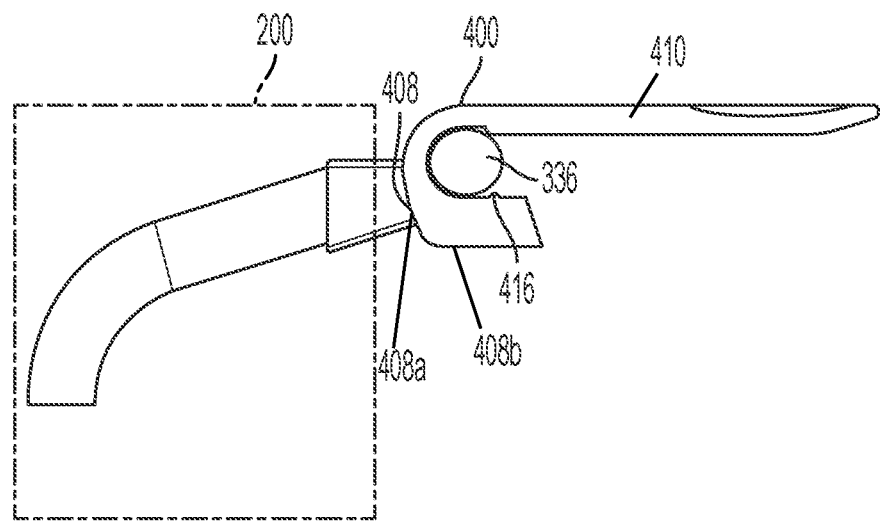
FIG. 10 is another cross-sectional view taken along section line 8-8 in FIG. 8 with the latch in an unlocked position.

As shown in FIGS. 1 and 2, the board 200 can be inserted into the stand 300 independent of the position of the latches 400, 404. The latches 400, 404 are movable between a locked position (FIG. 2) and an unlocked position (FIG. 1). In the illustrated embodiment, the latches 400, 404 are rotatable between the locked position and the unlocked position. In other embodiments, the latches 400, 404 may move in other manners (e.g., linearly slide, twist, thread, etc.). The board 200 can only be removed from the stand 300 when at least one of the latches 400, 404 is in the unlocked position. This is a result of the shape of a cam 408 of the latches 400, 404. As illustrated in FIGS. 7 and 9-10, the cam 408 has a curved surface 408a and a flat or planar surface 408b. The curved surface 408a is formed on a relatively thin section of the cam 408, while the flat surface 408b is formed on a relatively thick section of the cam 408. In the locked position shown in FIG. 9, the flat surface 408b engages the side edge 212 of the board 200. When both latches 400, 404 engage both side edges 212, 216 in the locked position, the board 200 is squeezed or compressed between the latches 400, 404, thereby securing the board 200 within the frame 304. In the unlocked position shown in FIG. 10, the latch 400 is moved (e.g., rotated) such that the cam 408 is spaced apart from the edge 212 of the board 200. In this position, the curved surface 408a of the cam 408 is aligned with the edge 212, but because the curved surface 408a is not as thick as the flat surface 408b, a gap is created between the latch 400 and the board 200. The board 200 is, thereby, removable from the frame 304.

Before a board 200 is inserted into the frame 304, the latches 400, 404 may automatically or naturally move (e.g., rotate) to the locked position due to gravity. Even in this position, a board 200 can be slid into the frame 304 without manually moving the latches 400, 404 to the unlocked position. When the board 200 is inserted into the frame 304, the bottom edge 204 of the board 200 contacts the curved surfaces 408a of the cams 408 as the board 200 is inserted. This causes the latches 400, 404 to automatically move (e.g., rotate) toward the unlocked position. Once the board 200 is fully inserted in the frame 304, a user actuates the latches 400, 404 to lock the board 200 in the frame 304. As shown in FIGS. 7 and 9-10, the latches 400, 404 have actuators 410 to permit actuation between the unlocked and the locked position. In the illustrated embodiment, the actuators 410 are handles that extend from and are integrally formed with the cams 408. In other embodiments, the latches 400, 404 may include other suitable actuators.

As best illustrated in FIG. 7, the latch 400 includes a stop 412. The stop 412 is configured to abut the wire frame 304, and specifically, the second portion 312 (or third portion 316) of the wire frame 304. The stop 412 may abut an underside of the second portion 312 that faces the surface S. The stop 412 abuts the wire frame 304 to restrain over rotation of the latch 400 relative to the wire frame 304. As such, when rotating the latch 400 counterclockwise from the unlocked position in FIG. 10 towards the locked position in FIG. 9, the stop 412 abuts the wire frame 304.

FIG. 5 illustrates the latch 400 in the locked position, and a connection between a groove 340 of the wire frame 304 and a mating surface 416 of the latch 400. The mating surface 416 corresponds with and engages the groove 340 to align the latch 400 relative to the groove 340. As a result, the latch 400 is located between the first side 328 and the second side 332 of the second portion 312 of the wire frame 304. In the illustrated embodiment, the latch 400 is centered between the first side 328 and the second side 332. As described above, the groove 340 may be otherwise located between the first side 328 and the second side 332. Similarly, the mating surface 416 can otherwise engage the groove 340 at the location of the groove 340.

As shown in FIGS. 4 and 5, the illustrated latch 400 includes hooks 420. The hooks 420 extend from the cam 408. More particularly, the hooks 420 extend from the flat surface 408*b* of the cam 408. When the board 200 is supported by the stand 300 and the latch 400 is in the locked position, the hooks 420 are configured to be positioned adjacent the first and second surfaces 220, 224 of the board 200. In some embodiments, the hooks 420 may abut or engage the first and second surfaces 220, 224 of the board 200. With the latch 400 engaging the groove 340 of the wire frame 304, the hooks 420 align the board 200 between the first side 328 and the second side 332 of the wire frame 304. As illustrated in FIG. 8, the board 200 can be centered between the first side 328 and the second side 332 of the wire frame 304 by contacting the hooks 420.

Various features of the invention are set forth in the following claims.

What is claimed is:

1. A support system comprising:
 a board having a first side edge, a second side edge, and an end edge,
 a wire frame having a first portion supporting the end edge of the board, a second portion extending from a first end of the first portion and receiving the first side edge of the board, and a third portion extending from a second end of the first portion and receiving the second side edge of the board, the wire frame having a width measured between the first and second ends and a depth measured perpendicular to the width, the width being greater than the depth; and
 a latch mounted adjacent a distal end of the second portion spaced from the first portion, the latch including a cam which squeezes the first side edge and the second side edge of the board together with the board positioned between the second portion and the third portion of the wire frame, the board being squeezed in a direction corresponding to the width of the wire frame to restrain movement of the board relative to the wire frame.

2. The stand of claim 1, wherein the latch is movable between an unlocked position in which the board is removable from the wire frame, and a locked position in which the latch restrains movement of the board relative to the wire frame.

3. The stand of claim 1, wherein the latch is operable to receive or release the board from the wire frame when the latch is in either an unlocked position in which the board is removable from the wire frame or a locked position in which the latch restrains movement of the board relative to the wire frame.

4. The stand of claim 1, wherein the latch is operable to move to an unlocked position in which the board is removable from the wire frame from a locked position in which the latch restrains movement of the board relative to the wire frame upon receiving an unlocking force sufficient to overcome a locking force holding the latch in the locked position.

5. The stand of claim 1, wherein the second portion is cantilevered to the first portion and is operable to deflect relative to the first portion as the latch restrains movement of the board relative to the wire frame.

6. The stand of claim 1, wherein the latch is rotatable relative to the second portion.

7. The stand of claim 1, further comprising a wheel coupled to the first portion, the wheel configured to facilitate movement of the wire frame along a surface.

8. The stand of claim 1, wherein the stand further includes a pad attached to the first portion, the pad configured to support the edge of the board and to restrain the board from sliding relative to the wire frame.

9. The stand of claim 1, further comprising a third portion extending from the first portion opposite the second portion.

10. The stand of claim 9, further comprising a second latch mounted on the third portion, the second latch operable to restrain movement of the board relative to the wire frame.

11. The stand of claim 1, wherein the second portion further comprises a first side, a second side, and a connecting side extending between the first side and the second side, wherein, when the board is supported by the wire frame, the first side, second side, and the connecting side wrap around a side edge of the board.

12. The stand of claim 1, wherein the latch includes a stop configured to abut the second portion to restrain overrotation of the latch relative to the second portion.

13. The stand of claim 1, wherein the second portion includes a groove and the latch includes a mating surface configured to engage the groove to align the latch relative to the groove.

14. The stand of claim 1, wherein the latch includes a hook, and wherein, when the board is supported by the stand, the hook is configured to abut the board and to align the board relative to the wire frame.

15. A support system comprising:
 a board including an edge,
 a frame having a first portion supporting the edge of the board, a second portion extending from the first portion and being cantilevered relative to the first portion;
 a wheel coupled to the first portion of the frame, the wheel configured to facilitate movement of the frame along a surface; and
 a latch mounted on the second portion adjacent a distal end of the second portion spaced from the first portion, the latch including a cam that pivots between a first position, in which the board is removable from the frame, and a second position, in which the cam squeezes the edge of the board and the board is restrained from movement relative to the frame, wherein the latch remains connected to the second portion of the frame in both the first position and the second position, wherein a space between the distal end of the second portion and the first portion permits the operation of the latch and receipt of the board within the space defined by the frame when the latch is in the first position and when the latch is in the second position, and wherein the second portion of the frame is deflected relative to the first portion of the frame as the latch moves between the first and second positions.

16. The stand of claim 15, wherein the wheel is a caster wheel configured to facilitate polydirectional movement of the wire frame along the surface in many directions.

17. The stand of claim 15, wherein the latch is operable to release the board from the wire frame only when the latch is in the first position.

18. The stand of claim 15, wherein the latch is operable to move to the first position from the second position upon receiving an unlocking force sufficient to overcome a locking force holding the latch in the second position.

19. A support system comprising:
a board having an end edge, a first side edge, and a second side edge; and
a stand including
a wire frame having a first portion that supports the end edge of the board, a second portion extending from the first portion along the first side edge of the board, the second portion including a first section and a second section that receive the first side edge of the board therebetween, and a third portion extending from the first portion along the second side edge of the board, the third portion including a first section and a second section that receive the second side edge of the board therebetween,
a wheel coupled to the wire frame to facilitate movement of the wire frame along a surface,
a first latch mounted on the second portion, the first latch including a first cam operable to engage the first side edge of the board to restrain movement of the board relative to wire frame, and
a second latch mounted on the third portion, the second latch including a second cam operable to engage the second side edge of the board to restrain movement of the board relative to the wire frame,
wherein the first latch is located between the first section and the second section of the second portion of the wire frame, and wherein the second latch is located between the first section and the second section of the third portion of the wire frame.

* * * * *